United States Patent [19]

Buyak et al.

[11] Patent Number: 4,736,197

[45] Date of Patent: Apr. 5, 1988

[54] TRANSIT SYSTEM THIRD RAIL WARNING SIGNAL

[75] Inventors: William P. Buyak, New Hartford, Conn.; Arthur L. Grodsky, Port Jefferson Station, N.Y.

[73] Assignee: General Signal Corporation, Conn.

[21] Appl. No.: 859,083

[22] Filed: May 2, 1986

[51] Int. Cl.$^4$ .............................................. G08B 21/00
[52] U.S. Cl. .................................... 340/654; 340/660; 340/47; 324/133; 191/29 R
[58] Field of Search ............... 340/660, 649, 628, 654, 340/657, 47, 48, 49, 50; 324/133, 51; 191/2, 15, 22 R, 29 R

[56] References Cited

U.S. PATENT DOCUMENTS

| | | | |
|---|---|---|---|
| 1,595,154 | 8/1926 | Harrison | 340/47 |
| 3,531,790 | 9/1970 | Staley | 340/660 X |
| 3,962,630 | 6/1976 | Chaffee | 324/133 X |
| 4,233,560 | 11/1980 | Blenman | 324/133 |
| 4,283,657 | 8/1981 | Gordon et al. | 340/628 X |
| 4,489,308 | 12/1984 | Logan, Jr. et al. | 340/628 X |

Primary Examiner—James L. Rowland
Assistant Examiner—Jeffery A. Hofsass
Attorney, Agent, or Firm—Robert R. Hubbard; Robert S. Smith

[57] ABSTRACT

Apparatus for indicating the presence of power on the third rail of a transit system having two running rails and a third rail includes a first connector for connecting to the third rail and a second connector for connecting to one of the running rails and a circuit for indicating the presence of a voltage between the first connector and the second connector and thereby indicating a voltage between the one running rail and the third rail, the means for indicating including visual and audible signaling apparatus. In some forms of the invention the apparatus may include an annunciator and a strobe light. Other forms of the invention include third and fourth connectors which are magnetically held to the rails.

21 Claims, 2 Drawing Sheets

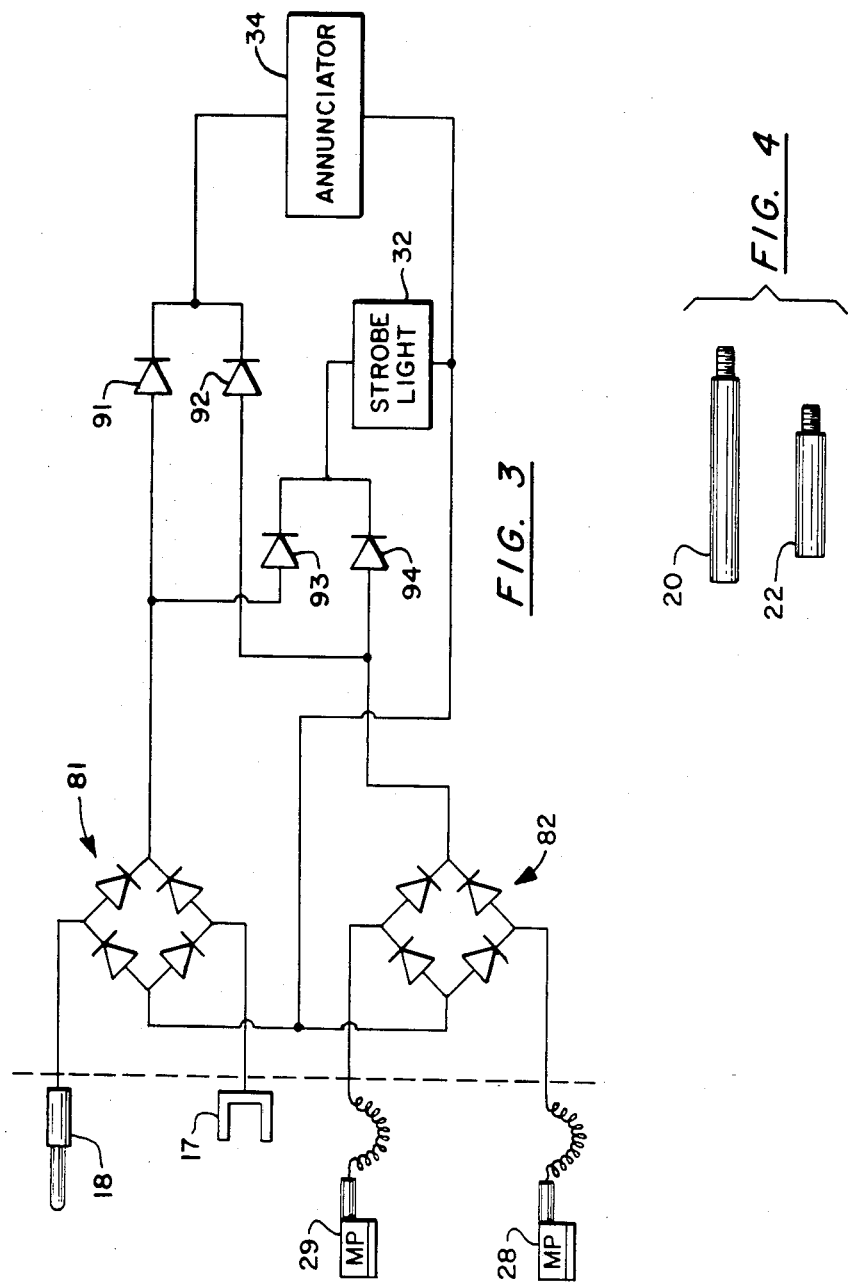

TRANSIT SYSTEM THIRD RAIL WARNING SIGNAL

BACKGROUND OF THE INVENTION

This invention relates to warning and alarm systems and particularly to warning and alarm systems adapted to communicate when a dangerous voltage is present on the third rail of a transit or railroad system. The typical transit system will have two running rails on which the wheels of the cars roll and a third rail which carries the electric power for the electric motors used to drive the transit cars. This voltage which may typically be 600 volts D.C., although specific systems may have substantially different voltages. The maintenance crews performing work in the vicinity of third rails must have the power turned off on the third rail to avoid an intolerably dangerous working condition. The power to the third rail is typically turned on and off from a remote panel which is not visible to the maintenance crew working near or on the rails.

DESCRIPTION OF THE PRIOR ART

Maintenance crews have relied on make-shift means for determining if a voltage is present on the third rail. These make-shift means have included the use of five conventional incandescent lamps connected in a series. This approach has been unsatisfactory because a single failure of any one of the lamps produced a visual signal which was identical to the signal when no voltage was present. More specifically, although an illuminated string of incandescent lamps connected between one running rail and the third rail indicates electrical power is present, an unlighted string of lamps indicates (1) no voltage is present or (2) that one of the lamps has a burned out filament or (3) there is a bad connection to one of the rails.

A hazard involved in using such apparatus is that the user typically must approach rather closely to the third rail which may be at a relatively high voltage. The high voltage is sufficiently dangerous so that even a slight brush against the third rail may be fatal.

Another disadvantage of this approach is that any series combination of lamps is effective only for a small range of voltages.

Another known approach was for the maintenance crew to throw a shovel across the third rail and the nearest running rail to see if sparks were produced. This test has the deficiency that a bad contact might be made with one of the rails causing the maintenance worker to believe there was no voltage on the third rail. This would be particularly likely when the shovel has a handle made of wood.

Other problems with both of these approaches include (1) the test is only a valid test at the instant at which the test is being conducted. In other words, the test is not a continuing test which would produce a very positive signal for the maintenance crew immediately upon turning on power to the third rail. The test can be completed in one instant and an instant later the power can be turned back on and there will be no indication of the power being on to warn the maintenance worker that a dangerous voltage level is present on the third rail. (2) Particularly with the light bulb approach the warning signal is merely a visual signal. (3) Each of the prior art techniques for indicating power on the third rail is dependant upon making a good electrical contact with one specific point on the running rail and one specific point on the third rail. Thus, the failure to make a good contact at either one of these points produces a false indication as to whether power is present on the third rail.

SUMMARY OF THE INVENTION

It is an object of the invention to provide a signaling device for signaling the presence of power on the third rail of a transit system which will provide both an audible and a visual signal indicating the presence of electrical power on the third rail.

It is another object of the invention to provide apparatus which will perform a continuing test to indicate the presence of power on the third rail.

Another object of the invention to provide apparatus which is less dependent on a single contact with each of two rails.

Still another object of the invention to provide apparatus which will function with a wide range of voltages on the third rail.

Yet another object of one embodiment of the invention to provide apparatus which is indiscriminate as to the manner of connection of the test leads so that either of two test leads may be connected to the running rail with the other test lead connected to the third rail.

Another object of the invention to provide apparatus which is adjustable to engage transit systems of various dimensions.

An additional object of the invention to permit the apparatus to be used simultaneously while allowing the passage of maintenance vehicles including had propelled vehicles on the running rails and thus minimize interference with maintenance operations which will frequently be conducted utilizing such vehicles.

It has now been found that these and other objects of the invention may be attained in apparatus for indicating the presence of power on the third rail of a transit system having two running rails and a third rail, which includes first means for connecting to the third rail, second means for connecting to one of the running rails and means for indicating the presence of a voltage between the first means for connecting and the second means for connecting and thereby indicating a voltage between the one running rail and the third rail, the means for indicating including means for providing a visual indication and means for providing an audible indication of the presence of a voltage in a predefined range.

In some forms of the invention means for providing an audible indication is an annunciator and the means for providing a visual indication is a strobe light. Other forms of the invention include third means for connecting to the third rail and fourth means for connecting to the one of the running rails and the means for indicating a voltage includes means for indicating the presence of a voltage between the third means for connecting and the fourth means for connecting and thereby provides an indication of a voltage between the one running rail and the third rail.

The apparatus may have a voltage regulation circuit which includes at least one zener diode. The means for indicating may include a discrete diode coupling each of the means for connecting. An OR circuit may couple the first means for connecting and the third means for connecting and the apparatus may include dual power supplies. The third means for connecting the one running rail and the fourth means for connecting includes a magnet in one preferred form of the invention. The first means for connecting the third rail may include an elongated tip support member having a replaceable tip.

In one form of the invention the apparatus includes means in the means for indicating which allows the connection of either the first or the second means for connecting to either the one running rail or the third rail as well as either the third or fourth means for connecting to either the one running rail. Such embodiments may include at least one full wave bridge rectifier.

BRIEF DESCRIPTION OF THE DRAWING

The invention will be better understood by reference to the accompanying drawing in which:

FIG. 3 is an electrical schematic of an alternate embodiment of the invention which includes provision for connection to the running rail and the third rail without regard to polarity.

FIG. 4 is plan view of a pair of rail probe extenders, of which one will customarily be used on any one transit system.

DESCRIPTION OF THE PREFERRED EMBODIMENTS

Figure 1:
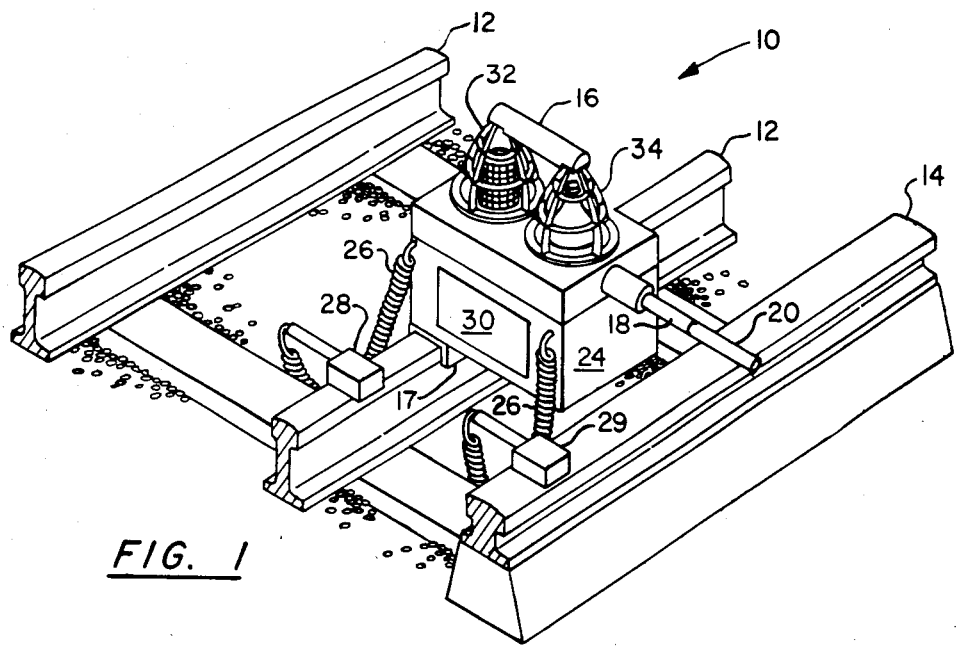
FIG. 1 is perspective view of one form of the apparatus in accordance with the invention.
Figure 2:
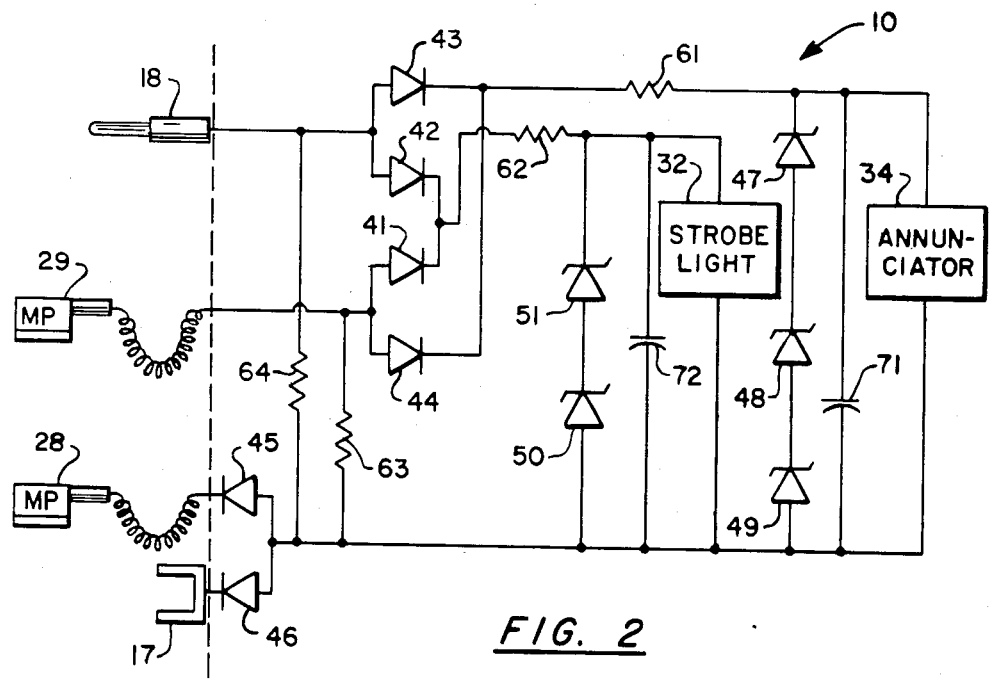
FIG. 2 is an electrical schematic of the apparatus shown in FIG. 1.

Referring now to FIGS. 1 and 2 there is shown a Third Rail Warning System 10 in accordance with one form of the invention. The Third Rail Warning System 10 is designed to cooperate with a typical transit system that has two running rails 12, 12 that carry the wheels of the transit or railroad car (not shown) and a third rail 14 that carries the electrical power that drives the electric motors (not shown) that drive the transit or railroad car.

The Third Rail Warning System 10 provides both an audio warning signal and a visual warning signal, to insure railroad or other personnel are alerted to dangerous third rail voltages. The Third Rail Warning System 10 is mechanically configured to be extremely rugged while still being light weight. The Third Rail Warning System 10 has two integral contacts; the first integral contact 17 is channel or saddle shaped to engage the top of one of the two running rails 12, 12; the second integral contact or probe 18 has interchangeable tips 20, 22 (both shown in FIG. 4) which engage the free end of the second integral contact 18 by means of screw threads in the preferred embodiment. For any given transit system the tip 20, or the tip 22 is chosen that best matches the spacing between the running rail 12 and the third rail 14. The second integral contact 18 extends from the Third Rail Warning System 10 enclosure or housing 24 as do two retractable coiled cords 26, 26 which are respectively connected to a pair of magnetic clamps or paddles 28, 29. These magnetic clamps or paddles 28, 29 provide redundant connections to the third rail 14 and the nearest running rail 12. The magnetic clamps or paddles 28, 29 are suitably insulated to protect personnel from the high voltage which will be present when the paddles 28, 29 are installed and power is on the third rail 14. The System 10 includes a convenient carrying handle 16.

The enclosure or housing 24 will ordinarily be manufactured of an electrically nonconductive material such as wood or plastic for safety reasons. A ferrous metal plate 30 on the side of the enclosure 24 provides a convenient place to secure the paddles 28, 29 when they are not in use.

Mounted on the top of the enclosure 24 is a strobe light 32 which in the preferred embodiment is a No. 97-S1 AdaptaBeacon (trademark) Strobe Beacon manufactured and sold by Edwards, a unit of General Signal, located in Farmington, Conn. Also mounted on the top of the the enclosure 24 is a multiple tone industrial signal or annunciator 34 which in the preferred embodiment is a No. 5531-31 Adaptone (registered trademark) multiple tone industrial signal manufactured and sold by Edwards, a unit of General Signal, of Farmington, Conn.

Referring now to FIG. 2 there is shown the electrical schematic for the embodiment of the invention shown in FIG. 1. The circuit has two separate internal power supplies, described below, to enhance reliability. A system of diodes, 41 through 46 assures only correct polarity can be applied to the internal circuits.

The diodes 41 through 46 have been wired to form a discrete "OR" circuit. When the paddle 29 or the probe 18 or both, are electrically positive with respect to the paddle 28 or the first integral contact 17, or both, the Third Rail Warning System 10 will signal an alarm when a voltage within an operating range of 500 to 1200 volts D.C. is present on the third rail 14. When the paddle 29 or the probe 18, or both, are electrically negative with respect to the paddle 28 or the first integral contact 17, or both, the diodes 41 through 46 are rendered electrically nonconductive (reverse polarity).

For example, when the Third Rail Warning System 10 is powered through paddle 29 (+), and the paddle 28 or first integral contact 17 or both the paddle 28 and the first integral contact 17, the diodes 42 and 43 are rendered nonconductive, effectively disconnecting the probe 18 from the internal source of potential. A resistor 64 provides a ground return path for any diode leakage currents.

When power is applied to the probe 18, the diodes 41 and 44 disconnect the paddle 29 from internal potential as described above. A resistor 63, likewise, provides a ground return path for any diode 41 or 44 leakage currents. This disconnect feature protects personnel from accidental shock, that is, if power (+) is applied to the paddle 29, the probe 18 would be effectively disconnected and therefore safe if accidentally touched.

The diodes 45 and 46 effectively disconnect the Third Rail Warning System 10 when subjected to reverse polarity (+). For example, if the paddle 28 which is normally connected to the running rail (−) was inadvertently connected to the third rail 14 (+), this polarity would render the diode 45 and/or the diode 46 electrically nonconductive, protecting the Third Rail Warning System 10.

The resistor 62, the diode 51, the diode 50, and the capacitor 72 form a shunt voltage regulator with the capacitor 72 acting to smooth and filter line transients. The Zener diodes 50, 51 define the upper voltage limits, in this case 240 V. Surplus line voltage is dropped across the resistor 62. The resistor 62 value will vary for specific installations depending on the intended operating voltage of the Third Rail Warning System 10. In other words, the strobe light 32 device receives 240 Volts D.C. even though the actual railroad track voltage may be greater than 240 Volts D.C.

The resistor 61, the diode 47, the diode 48, the diode 49, and the capacitor 71 form the power supply (240 Volts D.C.) for the annunciator or multiple tone industrial signal 34. The operation is the same as the power supply described in the preceding paragraph although the number of zener diodes differs.

The preferred embodiment includes the following items:

| diodes 41–44 | 400 PIV, 2 Amps. |
|---|---|
| capacitors 71–72 | 20 micro farad, 350 volts |
| zener diodes 47–49 | 1N3343A |
| resistors 61, 62 | 5K Ohms |
| resistors 63, 64 | 100K Ohms |

In operation, one paddle 28 is placed on the third rail 14 and the other paddle 29 connects to the nearest running rail 12. Both magnetic clamps or paddles 28 connect to the Third Rail Warning System 10 enclosure through a retractable electrical cord. When voltage exists between the running rail and third rail, the Third Rail Warning System 10 strobe light flashes and the annunciator or Multiple Tone Industrial Signal 34 produces one of thirteen factory selected warning signals. The Third Rail Warning System 10 operates from rail power, if present, without any need for batteries.

On occasion, railroad personnel have need to locate the Third Rail Warning System 10 on the ground between the running rail and the third rail. For example, this is necessary if a self propelled rail car has to pass through the work site. In this situation electrical contact is made to the tracks using the magnetic paddles 28, 29. This flexibility provides railroad personnel with continuous protection.

The embodiment of the invention show in the schematic of FIG. 3 is similar, however, it includes two full wave bridge rectifiers 81, 82. The probe 18 and first integral contact 17 are connected to the full wave bridge rectifier 81. In this embodiment the probe 18 may be connected to either the third rail 14 or the running rail 12 as long as the the first integral contact 17 is connected directly to the other of these two rails. Similarly, the paddles 28, 29 may be connected respectively to the third rail 14 or the nearest running rail 12 or may be connected in the opposite manner. The embodiment of FIG. 3 has opposite corners of each bridge 81, 82 connected to the third rail 14 and the nearest running rail 12. One of the other corners of the rectifier bridge 81, is connected to one of the corners of the other rectifier bridge. The remaining corner of each rectifier bridge is connected by one of the diodes 91–94 to either the strobe light 32 or the annunciator 34.

The Third Rail Warning System 10 has been designed to operate from 500 to 1200 Volts D.C. depending on the resistance values of the resistors 61 and 62. Other operating voltages are possible by proper selection of resistance values.

Functional reliability of the Third Rail Warning System has been enhanced through the utilization of redundant internal power supplies, one for the Strobe Light and one for the Multiple Tone Industrial Signal.

Those skilled in the art will recognize various alternatives such as the use of various other techniques for connecting to the running rail and the third rail. For example, the invention has application to transit systems using inductive coupling to transfer power to transit cars from a power source. Such alternatives shall be deemed to be encompassed by the disclosure, the invention being delimited only by the appended claims.

Having thus described our invention we claim:

1. Apparatus for indicating the presence of power on the third rail of a transit system having two running rails and a third rail, which comprises:
    first means for connecting to the third rail;
    second means for connecting to one of the running rails;
    third means for connecting to the third rail;
    fourth means for connecting to the one of the running rails;
    means for indicating the presence of a voltage between said first means for connecting and said second means for connecting and thereby indicating a voltage between the one running rail and the third rail, said means for indicating including means for providing a visual indication and means for providing an audible indication of a predetermined voltage; and
    said means for providing an audible indication comprises an annunciator;
    said means for providing a visual indication comprises a strobe light;
    said means for indicating a voltage also being responsive to a voltage between (1) said third means for connecting and (2) said fourth means for connecting.
2. The apparatus as described in claim 1 wherein:
    said means for indicating includes means for voltage regulation including at least one zener diode.
3. The apparatus as described in claim 2 wherein:
    each of said means for connecting is coupled to a discrete diode, said discrete diode being a part of said means for indicating.
4. The apparatus as described in claim 3 wherein:
    an OR circuit couples said first means for connecting and said third means for connecting.
5. The apparatus as described in claim 4 wherein:
    said means for indicating includes dual power supplies.
6. The apparatus as described in claim 1 further including:
    means for effectively disconnecting said apparatus if said means for indicating is connected with reversed from normal polarity connections whereby the danger of electrocution of a user is reduced.
7. The apparatus as described in claim 6 further including:
    means, in said means for indicating, for allowing the connection of one of said first and said second means for connecting to either the one running rail or the third rail.
8. The apparatus as described in claim 7 wherein:
    said means for indicating includes at least one full wave bridge rectifier.
9. The apparatus as described in claim 1 wherein:
    said third means for connecting and the fourth means for connecting each include a magnet.
10. The apparatus as described in claim 9 wherein:
    the apparatus includes an enclosure having a ferrous metal plate mounted on an external part thereof for use in magnetically holding said third and fourth means for connecting when said apparatus is not connected to the rails of an associated transit system.
11. The apparatus as described in claim 1 wherein:
    said first means for connecting the third rail comprises an elongated tip support member and a first replaceable tip.

12. The apparatus as described in claim 11 further includes:
a second tip having length different from said first replaceable tip, said first and second tips each being configured for engagement with said tip elongated support.

13. The apparatus as described in claim 12 wherein: said elongated tip support member has a threaded tip and said first and second tips are also threaded for cooperative engagement with said tip support.

14. The apparatus as described in claim 1 wherein: said means for indicating includes means for allowing the connection of one of said third and said fourth means for connecting to either the one running rail or the third rail.

15. The apparatus as described in claim 14 wherein: said means for indicating includes a first full wave rectifier bridge.

16. The apparatus as described in claim 15 wherein: said means for indicating includes a second full wave bridge rectifier.

17. The apparatus as described in claim 1 wherein: said second means for connecting includes a channel shaped member.

18. The apparatus as described in claim 1 wherein: said strobe light is omni-directional.

19. The apparatus as described in claim 1 wherein said means for indicating includes first and second independent means for sensing the voltage between the third rail and the one running rail and first and second independent means to indicate the presence of voltage between the third rail and the one running rail.

20. The apparatus as described in claim 19 wherein: a voltage sensed at either one of said first and second independent means for sensing will operate both said first and second independent means for indicating.

21. The apparatus as described in claim 20 wherein: said means indicating includes OR circuit.

* * * * *